United States Patent
Wihl et al.

(10) Patent No.: US 7,873,204 B2
(45) Date of Patent: Jan. 18, 2011

(54) METHOD FOR DETECTING LITHOGRAPHICALLY SIGNIFICANT DEFECTS ON RETICLES

(75) Inventors: Mark J. Wihl, Tracy, CA (US); Yalin Xiong, Union City, CA (US); Lih-Huah Yiin, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 960 days.

(21) Appl. No.: 11/622,432

(22) Filed: Jan. 11, 2007

(65) Prior Publication Data

US 2008/0170773 A1 Jul. 17, 2008

(51) Int. Cl.
G06K 9/00 (2006.01)

(52) U.S. Cl. ..................................... 382/144
(58) Field of Classification Search ................. 382/144
See application file for complete search history.

(56) References Cited

U.S. PATENT DOCUMENTS

| 6,577,994 | B1 | 6/2003 | Tsukuda |
| 7,440,093 | B1 * | 10/2008 | Xiong et al. ............. 356/237.4 |
| 2002/0152452 | A1 * | 10/2002 | Socha ......................... 716/21 |
| 2002/0192578 | A1 * | 12/2002 | Tanaka et al. ................. 430/30 |
| 2003/0082463 | A1 | 5/2003 | Laidig et al. |
| 2004/0228515 | A1 * | 11/2004 | Okabe et al. ................. 382/145 |
| 2005/0210437 | A1 * | 9/2005 | Shi et al. ....................... 716/19 |
| 2006/0270072 | A1 | 11/2006 | Ikenaga et al. |

OTHER PUBLICATIONS

Partial International Search Report in corresponding PCT Application PCT/US2008/050914, dated Aug. 13, 2008.
Kikuiri et al., "Development of Advanced Reticle Inspection Apparatus For Hp 65 Nm Node Device and Beyond," Photomask and Next-Generation Lithography Mask Technology XIII, Edited by Hoga, Morihisa. Proceedings of the SPIE, vol. 6283, pp. 62830Y (2006).

* cited by examiner

*Primary Examiner*—Brian P Werner
(74) *Attorney, Agent, or Firm*—Suiter Swantz pc llo (57) ABSTRACT

A method for identifying lithographically significant defects. A photomask is illuminated to produce images that experience different parameters of the reticle as imaged by an inspection tool. Example parameters include a transmission intensity image and a reflection intensity image. The images are processed together to recover a band limited mask pattern associated with the photomask. A model of an exposure lithography system for chip fabrication is adapted to accommodate the band limited mask pattern as an input which is input into the model to obtain an aerial image of the mask pattern that is processed with a photoresist model yielding a resist-modeled image. The resist-modeled image is used to determine if the photomask has lithographically significant defects.

20 Claims, 2 Drawing Sheets

METHOD FOR DETECTING LITHOGRAPHICALLY SIGNIFICANT DEFECTS ON RETICLES

TECHNICAL FIELD

The invention described herein relates generally to the detection of lithographically significant defects on photomasks. In particular, the invention relates to systems and methods for synthesizing accurate lithographic images (i.e. modified images that emulate images formed with production tools such as steppers, scanners, and the like) using conventional high-speed optical microscopes and specialized process instructions adaptable for use in many applications including, but not limited to, photomask inspection, photomask AIMS review, and photomask verification.

BACKGROUND

As the density and complexity of microcircuits continue to increase, the photolithographic process used to print the circuit patterns becomes more and more challenging. Denser and more complex circuits require denser and more complex patterns consisting of smaller pattern elements packed more closely together. Such patterns push the resolution limits of available lithography tools and processes and place serious burdens on the design and quality of the photomasks used therein. To push the resolution limits, advanced photomasks are designed using various Resolution Enhancement Techniques (RET). Optical Proximity Correction (OPC) is one such technique. With OPC the photomask patterns are modified in various ways to help ensure that the printed pattern has good agreement to the original desired pattern. These photomask pattern modifications can include perturbations to the size of main pattern features, the addition of serifs to pattern corners, and the addition of Sub-Resolution Assist Features (SRAFs). None of these pattern perturbations are expected to survive the printing process. Instead they are expected to cancel pattern perturbations that would otherwise have occurred during the printing process. Although these OPC features help to preserve the fidelity of the printed pattern, they cause the photomask patterns to be even more complex than they would otherwise be. The increased complexity of the photomask pattern and fact that not all pattern elements are expected to directly effect the printed pattern makes the task of inspecting the photomask for meaningful pattern defects much more difficult.

In an effort to address the need for accurate photomask pattern inspection, many approaches have been applied with varying degrees of success. The most common methods of photomask inspection involve capturing high-resolution images of the mask pattern using either an optical or electron beam microscope and then comparing these images to reference images to look for defects. The reference images can be either acquired images of a second pattern on the photomask (die-to-die) or can be rendered from the design database (die-to-database). In either case differences between the images under test and the reference images are flagged as defects. Since these methods find defects by comparing high-resolution images of the photomask patterns they can be characterized as mask plane inspection techniques. Although these techniques are effective at finding mask defects they are susceptible to detecting high numbers of "nuisance" defects. Nuisance defects are real defects in the mask pattern that have little or no impact on the fidelity of the printed pattern. In the mask plane these nuisance defects may not be readily distinguished from other more serious defects. One measure of a defect's importance is its MEEF or Mask Error Enhancement Factor. This factor relates the size of the defect in the mask plane to the magnitude of the impact it will have on the printed image. High MEEF defects have high impact on the printed pattern; low MEEF defects have little or no impact on the printed pattern. An undersized main pattern feature in a dense fine-line portion of a pattern is an example of a defect with high MEEF where a small mask plane sizing error could cause a complete collapse of the printed pattern. An isolated small pinhole is an example of a defect with low MEEF where the defect itself is too small to print and is distant enough from the nearest main pattern edge so as not to affect how that edge is printed. As these examples show the MEEF of a defect is a somewhat complicated function of the defect type and the pattern context in which the defect is located. Without knowing the MEEF the mask plane inspection techniques must assume that all mask defects are important. At the same time these masks are so complex that they cannot be made free of all defects. Inspecting with enough sensitivity to find defects that may be important in high MEEF areas can lead to the detections of large numbers of similarly sized but unimportant defects in low MEEF areas. Time and energy can be wasted dispositioning these nuisance defects. Therefore, it would be advantageous to have a "MEEF aware" method that identifies lithographically significant defects while selectively screening out the nuisance defects in a timely manner.

Another method of photomask inspection that attempts to be MEEF aware involves optically imaging the mask pattern using a microscope whose illumination and imaging conditions mimic those of the wafer stepper. It is reasoned that to the extent that the microscope emulates the stepper, the defects will experience the same MEEF at inspection time as they will at time of use. However this approach suffers from many limitations that impair the effectiveness of this approach. One limitation is the limited applicability of this method to "in-process" inspection of photomasks. Some mask making sequences involve multiple process steps where the pattern is established in an early process step but the optical properties of the mask at that step are not those expected by the stepper. Because the unfinished mask does not behave like a finished mask in the inspection tool, the tool cannot properly take into account the MEEF of each defect. Also, this approach suffers from the limited flexibility with which the inspection microscope can be reconfigured. To precisely mimic a given stepper the microscope needs to precisely match the illumination and imaging conditions of that stepper. However, there are many stepper variations, each having a variety of possible configurations. Accordingly, it is difficult to build the required level of flexibility and precision into the inspection microscope of the inspection platform. Absent suitable emulation optics, the inspection tool cannot properly take into account the MEEF of each defect. Another limitation to the effectiveness of this approach concerns the difficulty in emulating the high-NA effects that occur at the wafer plane of a stepper. Known approaches sense the image at the emulated wafer plane using one or more image sensors. Practical sensors, however, have pixel sizes that are many tens of times larger than that that would be needed at the true wafer plane of a stepper. Correspondingly, the magnification of the inspection microscope must be tens of time higher than the magnification of the actual stepper emulated. However, with increased magnification comes substantially decreased NA. At a much lower NA, vector imaging effects and angle dependent resist film effects differ significantly from those that would be experienced at the true wafer plane. These differences limit the accuracy of the stepper emulation and again lead to poor accounting for the MEEF of the defects detected.

Further limitations concern the general inadequacy of the photomask images acquired during inspection. Currently, these images are inadequate in terms of resolution, contrast and/or signal-to-noise ratio and thus are insufficient to enable adequate diagnosis of the nature of the defects on the mask. Therefore, an inspection method enabling the identification of photolithographically significant defects and being "MEEF aware" presents many advantages not present in conventional approaches known in the art.

Hybrid techniques for performing MEEF aware photomask inspections have been proposed. These techniques operate on a high-resolution image of the photomask to be inspected. From the image an estimated mask pattern is then input to a software simulation of the lithographic process that simulates the stepper and the resist yielding a simulated wafer plane image. Defect detection is then performed on a simulated wafer plane where the MEEF has already been taken into account. A serious shortcoming of these techniques involves the process by which a mask pattern is recovered from the high-resolution mask image. If the mask pattern (including defects) is known, than the high-resolution image of that pattern as seen by the inspection system optics can be determined by applying a proper partially coherent imaging model to the pattern. However, due to the highly non-linear aspects of such imaging models it is difficult to work backwards from the sensed image to the corresponding pattern. Heretofore, such techniques (those using approximations of this reverse transformation) have proven to be error prone and/or computationally expensive. Moreover, even the most computationally expensive approaches are subject to certain ambiguities and instabilities inherent in attempting to reverse a highly non-linear, lossy transformation. Although approximations can be made that are somewhat suitable over some range of inputs, all suffer from various limitations to their robustness that limit their applicability as part of a defect detection process.

Thus, although suitable for some purposes, each of the prior art techniques suffer from many limitations which substantially reduce their effectiveness in photomask inspection for meaningful pattern defects. Prior art processes are cumbersome, inaccurate, specialized, or inflexible and are not suitable from changing from one machine to another.

Accordingly, the embodiments of invention present substantial advances over the existing methodologies and overcome many limitations of the existing inspection arts. These and other inventive aspects of the invention will be discussed herein below.

SUMMARY OF THE INVENTION

In accordance with the principles of the present invention, methods for inspecting photomasks for lithographically significant defects are disclosed.

In one embodiment, the invention teaches a reticle inspection method for identifying lithographically significant defects. This involves providing a photomask and illuminating the mask to produce a transmission intensity image and a reflection intensity image of the photomask using an inspection apparatus having a larger NA at the reticle plane than the reticle plane NA of a lithography system used to pattern with the photomask. The transmission and reflection intensity images are processed together to recover a band limited mask pattern associated with the photomask and the inspection optical system. A model of the lithography system to be employed in lithographic transfer of the mask pattern onto a substrate is adapted to accommodate the band limited mask pattern as an input to obtain an aerial image of the mask pattern. The aerial image is processed together with a photoresist model for the photoresist used in the lithographic transfer of the mask pattern onto a substrate with said lithography system. Said processing yielding a resist-modeled image that corresponds to a printed image pattern printed onto the substrate using said photomask. The resist-modeled image is used to determine if the photomask has lithographically significant defects.

In another embodiment, the invention teaches a reticle inspection method to identify lithographically significant defects on the reticle. This involves producing a pair of intensity images of a photomask using an inspection apparatus. Each of the images is produced such that they experience different optical properties of the photomask. A band limited mask pattern is recovered from the pair of mask intensity images such that the band limited mask pattern characterizes the photomask using only linear terms. A model of a lithography system is adapted to enable input of the band limited mask pattern into the model to obtain an aerial image of the photomask pattern. The aerial image is processed together with a photoresist model of a substrate surface to yield a resist-modeled image that corresponds to an image pattern to be printed onto the substrate using said photomask. The photomask is inspected to determine if it has lithographically significant defects.

In another embodiment, a method for inspecting a photomask to identify lithographically significant defects on the reticle is further described. The method involving operations of: providing a photomask having at least a background tone and a foreground tone and producing a pair of mask images of the photomask using an inspection apparatus, each mask image experiencing a different optical property of the photomask. Each of the images capable of being characterized by a model that incorporates inspection system optical properties in the form of: a TCC matrix for the inspection apparatus convolved with the mask pattern of the photomask, a background amplitude constant that characterizes the background of the mask, an foreground amplitude constant that characterizes the foreground tone of the mask, and wherein a ratio of the background amplitude constants for the pair of images is not equal to a ratio of the foreground amplitude constants for the pair of images. The pair of mask images are processed together to recover a band limited mask pattern that includes only linear terms. The band limited mask pattern is modified to enable processing in a model of said lithography system. The modified band limited mask pattern is input into the model of the lithography system to obtain an aerial image of the mask pattern which is processed together with a photoresist model to obtain a resist modeled image that is compared with a reference to determine if the photomask has lithographically significant defects.

In another alternative embodiment the method is configured to analyze tri-tone, or multi-tone, or masks having phase-shift features. In such methodology, providing a photomask comprises a mask having a pattern including at least three tones: a darkest tone, a lightest tone, and an intermediate grey scale tone in between the darkest and lightest tone. Mask images are produced such that a first pair of images is produced that defines the mask pattern as a first pattern including the darkest tones and the greyscale tones and such that a second pair of images are produced that defines the mask pattern as a second pattern including the greyscale tones and the lightest tones. The mask images are processed together so that a first pair of images is processed together to recover a first band limited mask pattern associated with the darkest and greyscale tones and so that a second pair of images are processed together to recover a second band limited mask pattern associated with the greyscale and lightest tones. Both of the first and second band limited mask patterns are modified to enable processing in the model of said lithography system. Each of the first and second band limited mask patterns are input into the model of the lithography system to obtain a pair of aerial images that are processed together with the photoresist model to yield a pair of resist-modeled images. A first resist-modeled image corresponds to a mask pattern associated with the darkest tones and greyscale tones of the photomask and a second resist-modeled image corresponds to a mask pattern associated with the greyscale tones and lightest tones of the photomask. These resist-modeled images are used to determine if the photomask has lithographically significant defects.

In other method embodiment the invention pertains to a band-limited mask amplitude function and also a modified mask pattern function both used to be processed with reference images to generate comparison data used to characterize the mask.

These and other aspects of the present invention are described in greater detail in the detailed description of the drawings set forth hereinbelow. Accordingly, numerous aspects of the present invention are described in detail hereinbelow.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DESCRIPTION OF SPECIFIC EMBODIMENTS

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of a method and approach for detecting defects in a photomask or comparing a photomask with an intended pattern.

As indicated above, hybrid photomask inspection techniques for performing MEEF aware photomask inspections have many advantages over other approaches. However, as also indicated above, these techniques, as previously implemented, have shortcomings. One key shortcoming has been the way in which the mask pattern is recovered from the high-resolution mask image. Techniques used to date use an approximation of a reverse transformation that is prone to errors and/or is computationally expensive.

The inventors have discovered a method of avoiding many of the mask pattern recovery problems of the prior art by using a different process to recover the mask information. The method generally works as follows. A pair of related intensity images of the photomask in question are obtained using an inspection apparatus. The intensity images are obtained such that each of the images experience different optical properties of the photomask (e.g., transmission/reflection; images taken at differing wavelengths; as well as any of a number of different optical properties). These images are captured and aligned and then are processed together to recover a "band limited mask pattern" (described in significant detail below) that characterizes the photomask pattern with only linear terms (also described in detail below). Then a model of the lithography system (e.g., a stepper, scanner, or other related photolithography system) is adapted to enable the input of the band limited mask pattern (also described in detail below). By inputting the band limited mask pattern into the adapted model, an aerial image of the photomask pattern can be obtained. In this aerial image the distorting effects of the inspection tool optics are corrected for. The aerial image produced can then be processed with a photoresist model to yield a "resist-modeled image" that corresponds to an image pattern to be printed onto the substrate using the photomask. This resist-modeled image can then be compared with a number of different references to obtain defect information. In particular, due to the introduction of the lithography tool model, this defect information pertains to lithographically significant defects.

Figure 1A:
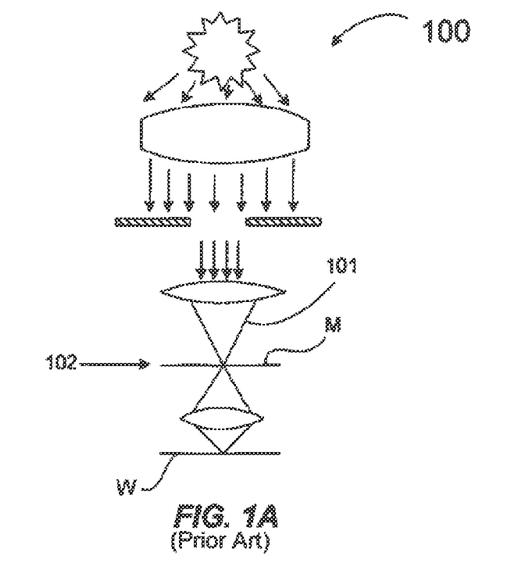
FIG. 1(a) is schematic depiction of a lithography apparatus, such a stepper or scanner, used to pattern a substrate or wafer.

FIG. 1A provides a simplified schematic depiction of an existing lithographic pattern transfer apparatus 100 that can be used to transfer a mask pattern from a photomask M onto a wafer W. Typical tools include scanners and steppers. A typical example of such a tool is a PAS 5500 available from ASML of Veldhoven, the Netherlands. Other such machines are available from Nikon Technologies and Canon, Inc. of Japan as well as Ultratech of San Jose, Calif., just to name a few. In general, an illumination source directs a light beam through illumination optics onto a selected portion of a photomask M located in a mask plane. The illumination optics have a numeric aperture 101 at the reticle plane 102. The illumination beam is directed onto a selected location of the mask M to form a patterned optical signal that is directed through reduction optics and onto a wafer (or other substrate that is coated with a photoimageable material (such as photoresist)) to effect pattern transfer.

Figure 1B:
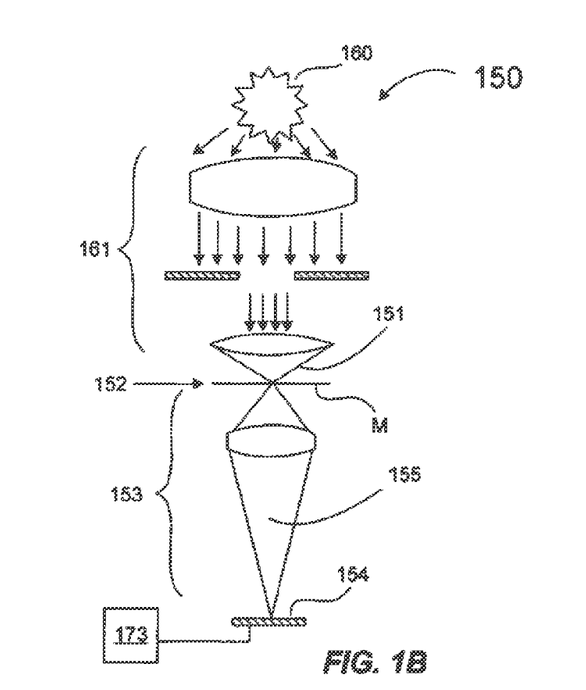
FIG. 1(b) is schematic depiction of a prior art inspection apparatus used to conduct mask inspection in accordance with the principles of the invention.

In contrast, the inspection apparatus 150 depicted in FIG. 1B has a high NA 151 at the reticle plane 152. The depicted inspection apparatus 150 includes microscopic magnification optics 153 designed to provide 60-200× magnification for enhanced inspection. The NA 151 at the reticle plane 152 of the inspection apparatus is considerable greater than the NA 101 at the reticle plane 102 of the lithography tool. Each of these optical systems (100, 150) induce different optical effects in the images produced. It is these different optical effects that embodiments of the present invention account for in the corrective processing disclosed herein.

An embodiment of the present invention can utilize standard inspection apparatus 150 such as described in simplified schematic representation of FIG. 1B. Such an embodiment uses an illumination source 160 that produces light that is directed through illumination optics 161 to produce a light beam that is directed onto a photomask M in the reticle plane 152. The light sources can be lasers or filtered lamps, but are not limited to such. In one example the source is a 193 nm laser. As explained above, the inspection apparatus 150 is configured with a NA at the reticle plane 151 that is higher than a reticle plane NA (e.g., 101) of an associated lithography tool. The photomask M to be inspected is placed at the reticle plane 152 and exposed to the source. The patterned image from the mask is directed through the microscopic magnification optical system (schematically depicted here as 153) which projects the patterned image 155 onto a sensor 154. Many different detectors can be employed by those having ordinary skill. Suitable detectors include CCD (charged coupled device) sensors, CCD arrays, TDI (time delay integration) sensors, TDI sensor arrays, PMT's, and many other sensors known to those having ordinary skill in the art In the depicted embodiment the detector 154 is a CCD array. The images captured by the sensor 154 can be processed by processing circuitry 173. The circuitry can form part of the inspection apparatus or can alternatively be located remotely from the inspection apparatus. Commonly, the circuitry includes microprocessors and associated memory which can be embodied in a computer suitable for enabling the principles described herein. One suitable implementation includes, but is not limited to the TeraScan series of DUV inspection tools available from KLA-Tencor of Milpitas, Calif. The inventors expressly contemplate that many other inspection tool may be able to implement process embodiments of the present invention.

The inventors have discovered a number of important relationships that enable the tools of the present invention to work. These have been formulated into process that can be used to identify lithographically significant defects on a photomask. A process embodiment of the present invention is described below in conjunction with the simplified flow diagram of FIG. 2.

Figure 2:
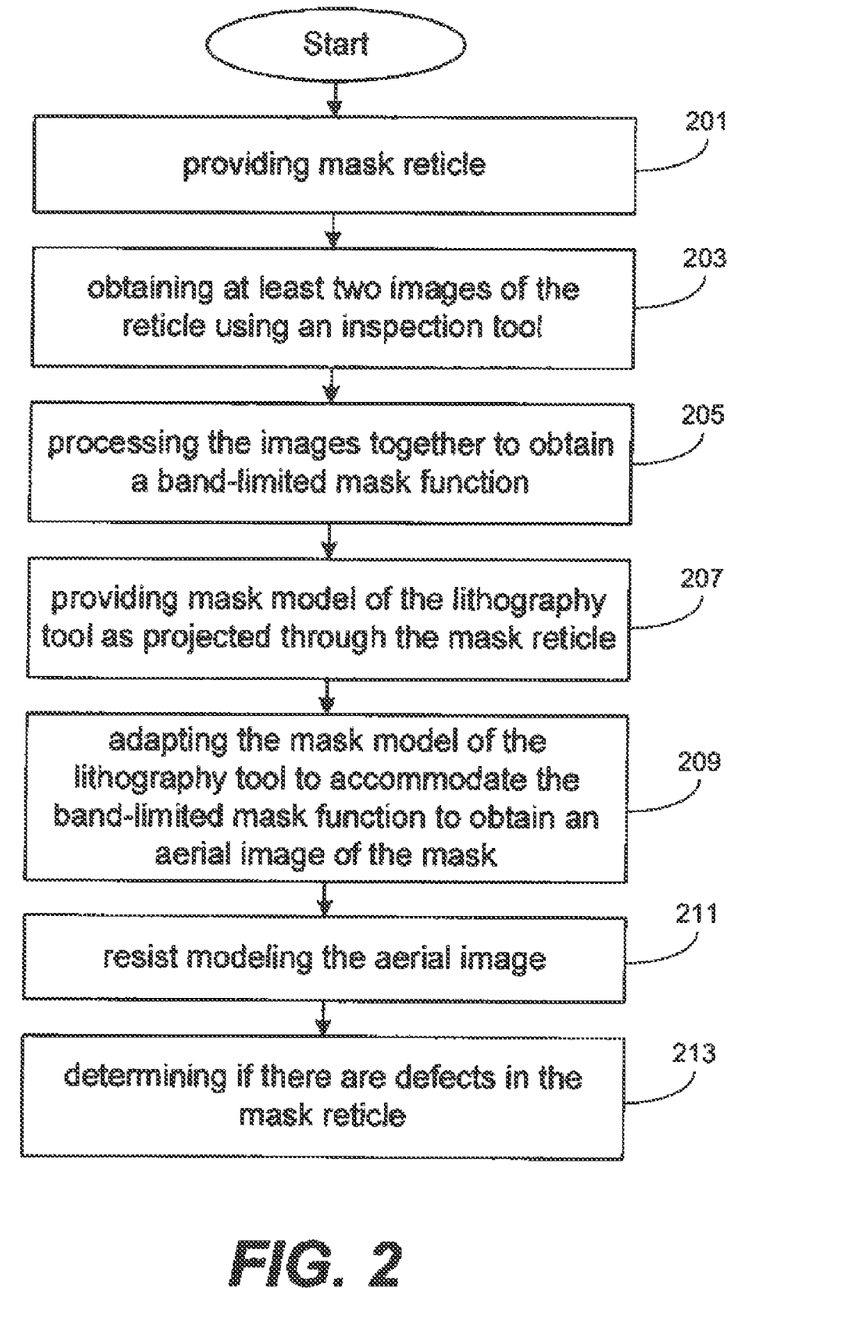
FIG. 2 is a simplified flow diagram illustrating a method embodiment and the operations used perform the embodiment in accordance with the principles of the invention.

A photomask to be used in a lithographic patterning is provided for inspection (Step 201). The reticle is placed in the inspection plane of an inspection tool (See, e.g., FIG. 1B). The inspection tool is used to obtain two images that map different optical properties of the mask (Step 203). In one embodiment the images comprise transmission intensity and reflection intensity images of the photomask. These images are then processed together to recover a band limited mask amplitude function that characterizes the mask pattern (Step 205). A model is then built from this recovered band limited mask amplitude function that describes the mask pattern as projected through the optical system of a lithography system to be employed in lithographic transfer of the mask pattern onto a substrate (Step 207). The model of the lithography system (as described in 207) is then adapted to accommodate the introduction of the band limited mask amplitude function to produce an aerial image of the mask pattern (Step 209). This adaptation is implemented by adjusting the basis kernels of the stepper imaging model to back out any roll-off within the pass band of the stepper due to the band limited nature of the recovered mask pattern. Once the aerial image is obtained, the aerial image is processed through a model of the photoresist used in the lithographic process (Step 211). Accordingly, this resist-modeled image corresponds to a printed image pattern formed by the inspected photomask on the substrate (wafer) using the photomask and the lithography tool. The resist-modeled image is then used to detect lithographically significant defects in the photomask under inspection (Step 213).

Further details of this approach are now explained more fully. The mask is illuminated by an inspection tool to enable image capture of two intensity images that experience different optical properties of the mask pattern. In one particular embodiment, the two different optical properties are transmission and reflection. Thus, the images comprise a transmission intensity image and a reflection intensity image. Additionally, the optical properties of the inspection tool are matched for both the first image and the second image. For example, in the case of transmission and reflection intensity images, a small adjustment is generally made to compensate for the small differences in optical paths for the transmitted signal relative to the reflected signal. Such adjustments (if any) depend on the specific geometries of the inspection tools involved. The idea being to match the imaging models of the optics for each of the images taken.

Once the inspection tool captures the images, the images are processed together to obtain a band limited mask amplitude function that describes the pattern on the mask.

It is known that partially coherent optical imaging can be modeled as a sum of coherent systems. In particular, the Hopkins Equations for partially coherent imaging can be used to form a TCC (Transmission-Cross-Coefficient) matrix. This matrix can be decomposed into its Eigen vectors. Each Eigen vector then acts as the kernel of a coherent system. The Eigen value weighted sum of the intensity contributions from each of these coherent systems then yields the image intensity out. Such equations are well known in the art and described in numerous publications. One such example is entitled "Sum of Coherent Systems Decomposition by SVD" by Nick Cobb dated Sep. 21, 1995 which is hereby incorporated by reference. Using such equations, the intensity for the transmitted signal can be described. The intensity of transmitted light image of the mask can be approximated as follows:

$$I_T(x,y) = \Sigma_{i=0}^N \lambda_i \| [c_T + a_T P(x,y)] \oplus E_i(x,y) \|^2 \quad \text{[Eqn. 1a]}$$

Where $I_T(x,y)$ describes the transmitted intensity image of a mask using the inspection system.

Wherein $c_T$ is the complex transmitted amplitude of the background tone of the mask. For example, in a quartz and chrome binary mask $C_T$ can describe properties of the chromium pattern.

Wherein $a_T$ is the complex transmitted amplitude of the difference between the mask foreground tone and the background tone. For example, using the same mask as above $a_T$ can describe the optical properties of the difference between the quartz and the chromium. $c_T$ and $a_T$ of course vary depending on the properties of the material layers described.

Also, $P(x,y)$ defines the mask pattern of the photomask being inspected.

$E_i$ and $\lambda_i$ refer, respectively, to the Eigen Vectors and Eigen Values of associated elements of a transmission cross-coefficient (TCC) imaging matrix associated with the inspection tool.

And wherein $\oplus$ describes a convolution operation.

Eqn. 1a can be expanded as follows:

$$I_T(x,y) = \sum_{i=0}^N \lambda_i \|a_T\|^2 \left\| P(x,y) \oplus \vec{E}_i(x,y) \right\|^2 + \quad \text{[Eqn. 1b]}$$
$$\sum_{i=0}^N 2\lambda_i D_1 \text{Re}(a_T c_T^*)[P(x,y) \oplus E_i(x,y)] + \sum_{i=0}^N \lambda_i \|c_T\|^2$$

$$I_T(x,y) = \sum_{i=0}^N \lambda_i \|a_T\|^2 \left\| P(x,y) \oplus \vec{E}_i(x,y) \right\|^2 + \quad \text{[Eqn. 1c]}$$
$$\sum_{i=0}^N 2\lambda_i D_1 \text{Re}(a_T c_T^*)[P(x,y) \oplus E_i(x,y)] + \|c_T\|^2$$

Where $D_i$ is the DC gain of $E_i$ and $\text{Re}(x)$ comprises the real component of x.

An analogous relation exists for the second image measurement of, for example, a reflection intensity image.

$$I_R(x, y) = \sum_{i=0}^{N} \lambda_i \|a_R\|^2 \left\| P(x, y) \oplus \vec{E}_i(x, y) \right\|^2 + \quad \text{[Eqn. 1d]}$$

$$\sum_{i=0}^{N} 2\lambda_i D_1 \text{Re}(a_T c_T^*)[P(x, y) \oplus E_i(x, y)] + \|c_R\|^2$$

Where $I_R(x,y)$ describes the reflected intensity image of a mask using the inspection system.

Wherein $c_R$ is the complex reflected amplitude of the background tone of the mask and $a_R$ is the complex reflected amplitude of the difference between the mask foreground tone and the background tone.

$E_i$, $\lambda_i$, and $D_i$ are the same as above because the optical systems obtaining the two images have well matched optical properties.

The inventors note that some prior art methods have operated on a single measurement using Eqn. 1a and then attempting a direct deconvolution to obtain $P(x,y)$. Such a method s described in U.S. Pat. No. 6,990,225 to Tanaka mentioned above. Again, the inventors point out that this method has limitations and can be computationally expensive.

However, the inventors have discovered that Eqn. 1c and Eqn. 1d can be algebraically combined to obtain a computationally manageable term. By combining the two functions Eqn. 1c and Eqn. 1d the inventors have discovered that the quadratic terms cancel each other out leaving a linear term that is referred to herein as a band limited mask amplitude function (also referred to as a band limited mask pattern). The inventors point out that the two images obtained above are aligned prior to combination in order achieve accurate results. This recovery of the band limited mask pattern is computationally derived as indicated below with respect to Eqn. 2.

$$\frac{\|a_R\|^2 (I_T(x, y) - \|c_T\|^2) - \frac{\|a_T\|^2 (I_R(x, y) - \|c_R\|^2)}{2\|a_T\|^2 \text{Re}(a_T c_T^*) -}}{2\|a_T\|^2 \text{Re}(a_R c_R^*)} = \sum_{i=0}^{N} \lambda_i D[P(x, y) \oplus E_i(x, y)] \quad \text{[Eqn. 2]}$$

$$= P(x, y) \oplus \sum_{i=0}^{N} \lambda_i D_i E_i(x, y)$$

$$= M(x, y)$$

The band limited mask pattern $M(x,y)$ is defined by the mask pattern $P(x,y)$ convolved with a function: $\Sigma_{i=0}^{N} \lambda_i D_i E_i(x, y)$ which is referred to herein as a "recovery kernel". Thus the band limited mask pattern is rather a modified version of the mask pattern $P(x,y)$.

The inventors have discovered that it is computationally easier to process band limited mask pattern through certain model than to obtain the mask pattern directly. This will be explained in detail hereinbelow.

However, the inventors stop here for a moment to point out that different optical parameters can be used to generate the band limited mask pattern for the photomask and inspection tool. For example, in the embodiment provided above, the images collected are reflection and transmission intensity images. The invention is not limited to such. For example, if the materials on the photomask are chosen such that they exhibit transmissions that are strong functions of wavelength, then two different but closely spaced wavelengths could be used to generate a pair of transmitted images each sensing different transmission levels. It is noted that when the optical parameters are the same (same illumination aperture extent and fill, same imaging aperture extent and apodization) and the pattern of the mask is the same, the only parameters that change are the constant values c and a, which deal with the foreground tone $c_x$ (e.g., $C_T$) and the constant $a_x$ ($a_T$) associated with the background tone. The parameters must be chosen such that, when the first image and the second image are combined, the quadratic terms cancel out and the linear terms are all that remain. As an example, such a relation is satisfied when $$\frac{c_1}{c_2} \neq \frac{a_1}{a_2}.$$

Thus, the present method is adaptable to a number of different optical configurations.

Once the band limited mask pattern $M(x,y)$ has been recovered (Step 205) it can be input into a properly adjusted model of the lithography system (Step 207) to be used to print patterns from the mask. The imaging model of lithography system (e.g., a stepper or scanner system) is similar to that introduced in Eqn. 1

$$I_{S_T}(x,y) = \Sigma_{i=0}^{N} \lambda_{S_i} \|[c_S + a_S \cdot P(x,y)] \oplus E_{S_i}(x,y)\|^2 \quad \text{Eqn. 3}$$

Wherein $P(x,y)$ defines the pattern on the photomask.

Where $Is_T(x, y)$ describes the transmitted intensity image of a mask using the lithography tool optical parameters (e.g., stepper system S parameters).

Wherein $c_s$ is the complex transmitted amplitude of the background tone of the mask and $a_s$ is the complex transmitted amplitude of the difference between the mask foreground tone and the background tone.

$E_{Si}$, $\lambda_{Si}$, refer, respectively, to the Eigen Vectors and Eigen Values of associated elements of a transmission cross-coefficient (TCC) imaging matrix associated with the lithography tool (S).

However, because we do not have the exact pattern $P(x,y)$ of the photomask and only have the band limited mask pattern $M(x,y)$, the model (Eqn. 3) must be adapted to accommodate the band limited pattern. This adaptation is described below.

$$I_{S_T}(x,y) = \Sigma_{i=0}^{N} \lambda_{Si} \|[c_S + a_S \cdot M(x,y)] \oplus F_i(x,y)\|^2 \quad \text{Eqn. 4}$$

Where $M(x,y)$ is the band limited mask pattern described above in Eqn. 2 and the supporting explanatory paragraphs. $F_i(x,y)$ defines a set of modified coherent bases that enable processing of the band limited mask pattern in the stepper model of Eqn. 4.

Eqn. 5 below defines the modification factors used to accommodate the band limited mask pattern $M(x,y)$ in the stepper model. Essentially, $F(x,y)$ describes a modified TCC matrix used to adjust for the band limited mask pattern $M(x,y)$ in the stepper model.

$$F_i(x, y) = \mathcal{J}^{-1} \frac{\mathcal{J}\{E_{S_i}\}}{\mathcal{J}\left\{\sum_{i=0}^{N} \lambda_i D_i E_i(x, y)\right\}} \quad \text{Eqn. 5}$$

Wherein $\mathcal{J}\{E_{s_i}\}$ describes a Fourier transform of the Eigen Vectors of a TCC matrix associated with the stepper.

Wherein $\mathfrak{I}\{\Sigma_{i=0}^{N}\lambda_i D_i E_i(x, y)\}$ describes a Fourier transform of the recovery kernel which is associated with the inspection tool.

The inventors point out that the TCC matrix for the stepper may involve many terms. However, because most of the energy is carried in the first few terms, accurate estimates can be obtained using only those terms (e.g., the first ten or so terms). Thus, if desired, a truncated model can be employed that significantly reduces the computational burden. In any case the inspector can obtain what ever degree of accuracy is desired by taking as many terms in the series as are needed to attain the desired level of accuracy. One of the particular advantages of this methodology is that the mask function can be obtained without the cost or errors associated with deconvolution.

By processing the band limited mask pattern through the modified stepper model of Eqn. 4 an aerial image is obtained that models the stepper behavior very well. As mentioned earlier this software model is easily adapted to any configuration of any stepper and has no problem modeling the high-NA effects that occur at the wafer plane.

The aerial image is then processed using a photoresist model that models the behavior of the photoresist used on the wafer (or other such imaged substrate) to obtain a pattern as it is to be formed on the substrate surface. This can be compared with a reference to determine the presence of lithographically significant defects. Such lithographically significant defects are those that are distinct from so-called "nuisance defects" which have little or no effect on the printed pattern. As such, for the purposes of this disclosure, lithographically significant defects are those defects having lithographic significance in the final printed pattern. That is to say, that some defects ("nuisance defects"), although present in the mask, have no significant impact on the printed pattern transferred to a photoresist layer. Examples include, defects so small (or on a lithographically insensitive portion of the pattern) as to be largely irrelevant. Also, a defect can be formed in a relatively defect insensitive portion of the substrate. In some cases a defect can be formed on an assist or OPC feature (or other resolution enhancement feature) but be of such character that it does not affect the final printed pattern. Thus, a lithographically significant defect is a defect that is present on the mask and can cause a significant effect in the lithographically transferred pattern. Such lithographically significant defects can cause problems related to circuit failures, sub optimal performance, and so on.

In one embodiment the detection of lithographically significant defects is done in a die-to-database mode. In this mode, the resist image obtained in the process above is compared to a database rendered image of what is expected in the resist image. Such a database rendered image is produced by processing the database pattern through mask writing and etching models to obtain the reference mask pattern. This reference mask pattern is then propagated through the stepper (or scanner) model to produce the reference aerial image. The reference aerial image is then further processed through the resist model to form the reference resist image. This reference image is aligned with the resist image under test and the two images are compared. This comparison can be repeated using different lithography modeling parameters to simulate various focus and exposure conditions that span the extremes of the intended process window. If the test and reference resist images differ significantly during any of the comparisons defects are flagged. Thus, the present embodiments disclose methods for determining how the actual mask performs relative to the expected performance over the process window.

In another embodiment the detection of lithographically significant defects is done in a die-to-die mode. In this mode, the resist image to be tested is compared with a second such image obtained from a second site on the photomask that is intended to contain an identical pattern. Such an inspection can be used when the photomask is for instance a two-die reticle. As with die-to-database comparison, this comparison can be repeated using different lithography modeling parameters to simulate various focus and exposure conditions that span the extremes of the intended process window.

The inventors have further discovered that the process can be applied to multiple tone masks as well. One example of such masks are tritone masks having a darkest region (e.g., a chrome or opaque regions) and a quartz or lightest region with a pattern of grey scale regions having a darkness between the two. Such grey scale regions can be obtained in number of ways (e.g., using EPSM materials and so on). The inventors have discovered that a method embodiment whereby the mask is treated as two different masks which are separately analyzed can be employed. For example, a tri-tone mask can be treated using the same models as described above. However, the tri-tone mask can be treated as a mask having a background pattern (e.g., chromium) with the grey scale pattern (e.g., EPSM material) treated as the foreground. The images can be processed as above using the same equations and process operations. A second analysis is performed on the mask using the EPSM material as the background pattern and the lightest pattern (e.g., the quartz) treated as the foreground. Alignment can easily be effectuated because each of the materials have substantially differing properties that demonstrate different edge effects which can be used to align the images. The mask patterns can then be summed and then compared to references in die-to-die or die-to-database comparisons to verify wafer pattern correctness through out the process window and to identify lithographically significant defects.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element, which is not specifically disclosed herein.

We claim:

1. A method for inspecting a photomask to identify lithographically significant defects, the method comprising:
   providing a photomask for inspection, the photomask configured to achieve photolithographic transfer of a mask pattern onto a substrate using a lithography system;
   producing a transmission intensity image and a reflection intensity image of the photomask using an inspection apparatus having a larger numerical aperture at the reticle plane than that of the lithography system;
   processing the transmission intensity image and the reflection intensity image together to recover a band limited mask pattern;

providing a model of the lithography system to be employed in lithographic transfer of the mask pattern onto a substrate;

adapting the model of the lithography system so that the band limited mask pattern can be input into the model of the lithography system to obtain an aerial image of the mask pattern;

processing the aerial image together with a photoresist model consistent with the photoresist used in the lithographic transfer of the mask pattern onto a substrate with said lithography system, said processing yielding a resist-modeled image that corresponds to a printed image pattern printed onto the substrate using said photomask; and determining if the photomask has lithographically significant defects.

2. The method recited in claim 1 wherein adapting a model of the lithography system is conducted so that the band limiting effects of the inspection apparatus are removed.

3. The method recited in claim 1 wherein determining if the photomask has lithographically significant defects comprises comparing the resist modeled image with a database model of the printed pattern.

4. The method recited in claim 1 wherein determining if the photomask has lithographically significant defects comprises comparing a resist modeled image of a first die produced by the inspection apparatus with another resist modeled image of a second die produced by the inspection apparatus.

5. The method recited in claim 1 wherein processing the transmission intensity image and the reflection intensity image comprises characterizing the transmission intensity and the reflection intensity using mask intensity models that incorporate optical properties of the inspection system.

6. The method recited in claim 1 wherein processing the transmission intensity image and the reflection intensity image together yields a band limited mask pattern that includes a photomask pattern convolved with a recovery kernel.

7. The method recited in claim 6 wherein processing the band limited mask pattern comprises defining the band limited mask pattern as:

$$P(x,y) \oplus \Sigma_{i=0}^{N} \lambda_i D_i E_i(x,y)$$

where P(x,y) defines the mask pattern of the photomask;

where $\Sigma_{i=0}^{N} \lambda_i D_i E_i(x,y)$ defines a recovery kernel associated with the inspection apparatus;

where $\lambda_i$ is an Eigen value associated with the Eigen vectors ($E_i$) of a TCC matrix associated with the inspection apparatus; and where $D_i$ defines the DC gain associated with $E_i$.

8. The method recited in claim 6 wherein adapting a model of the lithography system so that the band limited mask pattern can be input into the model of the lithography system to obtain an aerial image of the mask pattern comprises obtaining a set of modified coherent bases associated with said lithography system.

9. The method recited in claim 8 wherein obtaining a set of modified coherent bases associated with said lithography system comprises obtaining an inverse Fourier transform of: the Fourier transform of the coherent bases associated with said lithography system divided by the Fourier transform of the recovery kernel.

10. The method recited in claim 9 wherein obtaining a set of modified coherent bases associated with said lithography system comprises obtaining an inverse Fourier transform of:

$$\frac{J\{E_{Si}\}}{J\left\{\sum_{i=0}^{N} \lambda_i D_i E_i(x,y)\right\}}$$

wherein the numerator is the Fourier transform of the Eigen Vectors of a TCC matrix associated with the lithography system used to pattern thus substrate; and wherein the denominator is the Fourier transform of the recovery kernel associated with the inspection system used to inspect the photomask.

11. A method for inspecting a photomask to identify lithographically significant defects on the reticle, the method comprising:

producing a pair of intensity images of a photomask using an inspection apparatus, each of the images experiencing different optical properties of the photomask;

processing the pair of mask intensity images together to recover a band limited mask pattern that characterizes the photomask with only linear terms;

adapting a model of a lithography system to enable the input of the band limited mask pattern into the adapted model to obtain an aerial image of the photomask pattern;

processing the aerial image together with a photoresist model to yield a resist modeled image that corresponds to an image pattern to be printed onto the substrate using said photomask; and determining if the photomask has lithographically significant defects.

12. A method for inspecting a photomask to identify lithographically significant defects on the reticle, the method comprising:

providing a photomask having at least a background tone and a foreground tone, the mask configured for lithographic mask pattern transfer onto a substrate using a lithography system;

producing a pair of mask images of the photomask using an inspection apparatus, each of the images capable of being characterized by a model that incorporates inspection system optical properties in the form of: a TCC matrix for the inspection apparatus applied to the mask pattern of the photomask, a background amplitude constant that characterizes the background of the mask, a foreground amplitude constant that characterizes the foreground tone of the mask, and wherein a ratio of the background amplitude constants for the pair of images is not equal to a ratio of the foreground amplitude constants for the pair of images;

processing the pair of mask images together to recover a band limited mask pattern that includes only linear terms;

modifying the band limited mask pattern to enable processing in a model of said lithography system;

inputting the modified band limited mask pattern into the model of the lithography system to obtain an aerial image of the mask pattern;

processing the aerial image together with a photoresist model consistent with the photoresist used in the lithographic transfer of the mask pattern onto a substrate with said lithography system, said processing yielding a resist modeled image that corresponds to a printed image pattern printed onto the substrate using said photomask; and determining if the photomask has lithographically significant defects.

13. The method recited in claim 12 wherein producing a pair of mask images comprises producing a first image and a second image wherein the first image is produced by illumination with a first wavelength of light and wherein the second image is produced by illumination with a second wavelength different from the first wavelength.

14. The method recited in claim 12 wherein producing a pair of mask images comprises producing a transmission intensity image and producing a reflection intensity image.

15. A method as recited in claim 12 wherein, providing a photomask comprises:
  providing a mask having a pattern including at least three tones: a darkest tone, a lightest tone, and an intermediate grey scale tone in between the darkest and lightest tone;
  wherein, producing a pair of mask images comprises:
    producing a first pair of images that defines the mask pattern as a first pattern including the darkest tones and the greyscale tones, and
    producing a second pair of images that defines the mask pattern as a second pattern including the greyscale tones and the lightest tones;
  wherein, processing the pair of mask images together comprises:
    a first processing of the first pair of images to recover a first band limited mask pattern associated with the darkest and greyscale tones, and
    a second processing of the second pair of images to recover a second band limited mask pattern associated with the greyscale and lightest tones;
  wherein, modifying the band limited mask pattern comprises:
    modifying both first and second band limited mask patterns to enable processing in the model of said lithography system;
  wherein, inputting the modified band limited mask pattern into the model comprises:
    inputting each of the first and second band limited mask patterns into the model of the lithography system to obtain a pair of aerial images of the mask pattern; and
  wherein, processing the aerial images comprises:
    processing each of the pair of aerial images together with the photoresist model to yield a pair of resist modeled images, a first resist modeled image that corresponds to a mask pattern associated with the darkest tones and greyscale tones of the photomask and a second resist modeled image that corresponds to a mask pattern associated with the greyscale tones and lightest tones of the photomask.

16. A method for generating a band limited mask amplitude function from a photomask, the method comprising:
  providing a photomask configured to achieve lithographic transfer of a mask pattern onto a substrate using a lithography system;
  illuminating the photomask;
  capturing a transmission intensity image of said illuminated photomask;
  capturing a reflection intensity image of said illuminated photomask; and
  processing the transmission intensity image together with the reflection intensity image to recover a band limited mask amplitude function such that quadratic terms of the function cancel each other out leaving a linear band limited mask amplitude function characterized by the mask pattern convolved with a recovery kernel.

17. The method recited in claim 16 wherein the linear band limited mask amplitude function is characterized as:

$$P(x,y) \oplus \Sigma_{i=0}^{N} \lambda_i D_i E_i(x, y)$$

where P(x,y) defines the mask pattern of the photomask;

where $\Sigma_{i=0}^{N} \lambda_i D_i E_i(x, y)$ defines a recovery kernel associated with the inspection apparatus;

where $\lambda_i$ is an Eigen value associated with the Eigen vectors ($E_i$) of a TCC matrix associated with the inspection apparatus; and where $D_i$ defines the DC gain associated with $E_i$.

18. A method for modifying lithography tool intensity model to accommodate a band limited mask amplitude function that includes a convolved mask pattern obtained from an inspection mask intensity model operating on a photomask, the method comprising:
  providing a band limited mask amplitude function that includes a convolved photomask pattern obtained from an inspection mask intensity model adapted to accommodate the optical parameters of a mask inspection apparatus;
  providing a model that describes the optical parameters of a lithography tool as projected through the photomask pattern wherein the model includes that mask pattern convolved over a series of coherent bases defined by a TCC matrix of the lithography tool; and
  modifying said model to accommodate a substitution of the band limited mask amplitude function in place of the mask pattern convolved over a series of coherent bases defined by a TCC matrix of the lithography tool.

19. A method as recited in claim 18 wherein modifying said model to accommodate a substitution of the band limited mask amplitude function in place of the mask pattern convolved over a series of coherent bases defined by a TCC matrix of the lithography tool comprises determining the inverse Fourier transform of:

$$\frac{J\{E_{Si}\}}{J\left\{\sum_{i=0}^{N} \lambda_i D_i E_i(x, y)\right\}}$$

wherein the numerator is the Fourier transform of the Eigen Vectors of the TCC matrix associated with the lithography system; and wherein the denominator is the Fourier transform of a recovery kernel associated with the band limited mask amplitude function.

20. A method for inspecting a photomask to identify lithographically significant defects, the method comprising:
  providing a photomask for inspection, the photomask configured to achieve photolithographic transfer of a mask pattern onto a substrate using a lithography system;
  producing a pair of intensity images of a photomask using an inspection apparatus, each of the images experiencing different optical properties of the photomask;
  processing the pair of intensity images together to recover a band limited mask pattern;
  providing a model of the lithography system to be employed in lithographic transfer of the mask pattern onto a substrate;

adapting the model of the lithography system so that the band limited mask pattern can be input into the model of the lithography system to obtain an aerial image of the mask pattern;

processing the aerial image together with a photoresist model consistent with the photoresist used in the lithographic transfer of the mask pattern onto a substrate with said lithography system, said processing yielding a resist-modeled image that corresponds to a printed image pattern printed onto the substrate using said photomask; and determining if the photomask has lithographically significant defects.

* * * * *